United States Patent [19]

Kawai

[11] 3,909,640

[45] Sept. 30, 1975

[54] CRYSTAL VIBRATOR MOUNTING

[75] Inventor: Masanori Kawai, Nagano, Japan

[73] Assignee: Kabushiki Kaisha Suwa Seikosha, Tokyo, Japan

[22] Filed: Mar. 26, 1974

[21] Appl. No.: 454,888

[30] Foreign Application Priority Data

Mar. 27, 1973 Japan ............................... 48-34107

[52] U.S. Cl. .................... 310/9.1; 310/8.2; 310/9.4; 58/23 TF

[51] Int. Cl.$^2$.......................................... H01L 41/04

[58] Field of Search .............................. 310/9.1–9.4, 310/8.2, 21, 22, 25; 58/23 V, 23 TF

[56] References Cited

UNITED STATES PATENTS

| | | | |
|---|---|---|---|
| 2,666,196 | 1/1954 | Kinsley et al. | 310/9.6 X |
| 3,683,213 | 8/1972 | Staudte | 310/8.2 X |
| 3,697,766 | 10/1972 | Ganter | 310/8.2 |
| 3,697,789 | 10/1972 | Kato et al. | 310/8.2 X |
| 3,795,831 | 3/1974 | Fujita | 310/8.2 X |

*Primary Examiner*—Mark O. Budd
*Attorney, Agent, or Firm*—Blum, Moscovitz, Friedman & Kaplan

[57] ABSTRACT

A mounting is provided for mounting a tuning fork type crystal vibrator in a hermetically sealed oscillator envelope. The mounting comprises a pair of discrete elements depending from the oscillator terminal tag and each element includes a shoulder connected thereto, an arm connected to the shoulder and forming an elbow therewith, an inwardly arranged finger connected to the arm and forming an elbow therewith, a downwardly arranged flange from the finger and a cradle member depending laterally extending between the flanges and connecting the flanges. The mounting elements are arranged in the oscillator envelope so that each cradle member supports a tine of the tuning fork vibrator.

9 Claims, 5 Drawing Figures

CRYSTAL VIBRATOR MOUNTING

BACKGROUND OF THE INVENTION

This invention relates to an improved quartz crystal oscillator for a timepiece and more particularly, the instant invention relates to an improved mounting for a tuning fork type crystal vibrator employed therein.

In prior timepiece devices which employ oscillators including a quartz crystal vibrator, the vibrator element has been suspended on wire supports within the hermetically sealed oscillator envelope. The wire supports have been connected to the sealed oscillator terminal tag. This mounting is troublesome, costly, enlarges the over-all size of the oscillator, and requires considerable assembly skill. Alternatively, the crystal vibrator has been mounted in parallel to the oscillator terminal tag on a finger extending upwardly therefrom within the oscillator envelope. However, it has been necessary to provide the crystal vibrator element with opposed notches for thereby making the vibrator arms independent of each other. The notches are difficult to make and weaken the crystal, thereby making it incapable of withstanding severe external shock.

There is, therefore, a need for a vibrator mounting which is inexpensive, easy to manufacture, capable of withstanding severe external shock, and which can be employed to fabricate a compact oscillator.

SUMMARY OF THE INVENTION

Generally speaking, in accordance with the invention, a novel mounting is provided for mounting a tuning fork type crystal vibrator in an improved hermetically sealed oscillator. The mounting comprises a pair of discrete elements depending from the oscillator terminal tag and each element includes a shoulder connected thereto, an arm connected to the shoulder and forming an elbow therewith, an inwardly arranged finger connected to the arm and forming an elbow therewith, a downwardly arranged flange depending from the finger and a cradle member providing a transverse connection between the flanges. The mounting is arranged in the oscillator container so that the cradle member supports the root of the tuning fork type crystal vibrator.

Accordingly, it is an object of this invention to provide an improved oscillator for a timepiece.

Another object of the invention is to provide a novel mounting for a tuning fork type crystal vibrator mounted in a timepiece oscillator.

A further object of the invention is to provide a mounted crystal vibrator which maintains an optimum Q value.

Still another object of the invention is to provide a mounting for the vibrator element within an oscillator which is capable of withstanding severe external shock.

Still other objects and advantages of the invention will, in part, be obvious and will, in part, be apparent from the specification.

The invention accordingly comprises the features of construction, combinations of elements, and arrangement of parts which will be exemplified in the constructions hereinafter set forth and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
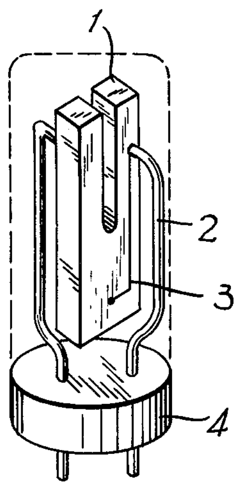
FIG. 1 PRIOR ART
FIGS. 1 and 2 are perspective views of prior art oscillators and conventional mountings for the vibrator element therein.
Figure 2:
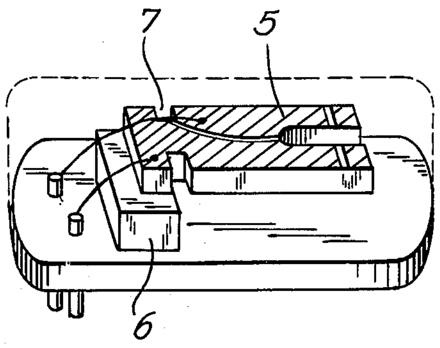
FIG. 2 PRIOR ART

FIGS. 1 and 2 show conventional mountings for tuning fork type quartz crystal vibrators in conventional timepiece oscillators. In FIG. 1, a tuning fork type crystal vibrator 1 is mounted on terminal tag 4 within the hermetically sealed oscillator envelope by respective suspension wires 2 and 3. The suspension wires are connected to the root support of the vibrator element.

Referring now to FIG. 2, a tuning fork type vibrator element 5 is secured to finger 6 mounted on the oscillator terminal tag and extending upwardly therefrom. The envelope for the oscillator is hermetically sealed to the terminal tag. A pair of opposed coaxial notches 7 are provided in the base of vibrator 5 for thereby making the respective mounted shoulders and base of the vibrator which are secured to oscillator finger 6 independent of vibrations which occur through the vibrating tines of crystal 5.

As hereinbefore set forth, the prior art oscillator embodiment shown in FIG. 1 is difficult to fabricate, bulky and delicate; while the prior art oscillator embodiment shown in FIG. 2 is incapable of withstanding severe external shock and moreover opposed, coaxial notches 7 provided in crystal 5 are difficult to make.

Figure 3:
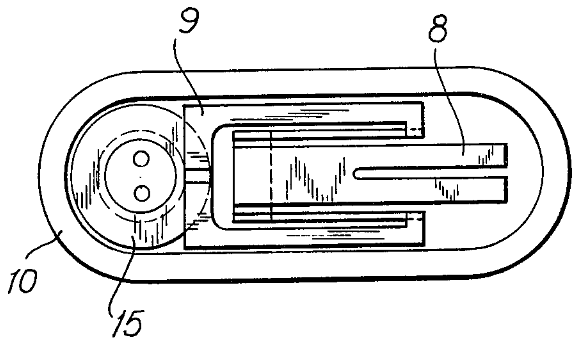
FIG. 3 is a top plan view of an oscillator provided with a tuning fork type vibrator mounted in accordance with the invention.
Figure 4:
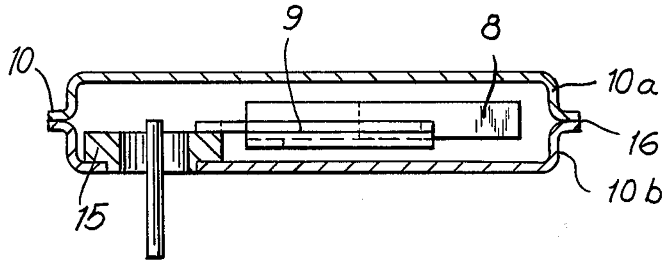
FIG. 4 is a sectional view of the oscillator, crystal and mounting shown in FIG. 3.
Figure 5:
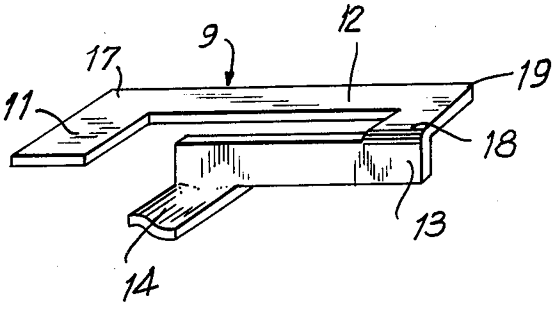
FIG. 5 is an exploded perspective view of one of the discrete mounting elements constructed in accordance with the invention which is employed in the embodiment shown in FIGS. 3 and 4.

Referring now to FIGS. 3, 4 and 5, a tuning fork type crystal vibrator 8, preferably of quartz, is mounted in hermetically sealed oscillator 10 by means of symmetrical mounting members 9 which is elastic. Suitable materials from which mounting member 9 may be fabricated include phosphorous bronze, beryllium copper, elastic steel, and the like. The suitable material may be press formed to the configuration shown in FIG. 5.

Each mounting element includes a shoulder 11, at which the element is connected to the terminal tag 15 which is mounted in the envelope wall of the evacuated oscillator, as by a suitable organic adhesive or wax. A resilient spring arm 12 is connected to shoulder 11 at an elbow 17. The resiliency in spring arm 12 is normal to the vibrating direction of vibrator 8. An inwardly arranged finger 18 is connected to resilient spring arm 12 at an elbow 19 and depending therefrom is a downwardly arranged resilient spring flange 13 wherein the resilient character thereof is parallel to the vibrating direction of vibrator 8. A cradle member 14 transversely connects flanges 13 for receiving and supporting the root of vibrator 8.

As shown particularly in FIG. 3, the mounting elements 9 are coplanar and are arranged in mirror image relationship, relative one to the other. Vibrator 8 is cradled and supported on cradle member 14. As mounted, crystal 8 extends above a plane through opposed resilient spring arms 12 of elements 9 of the mounting.

Oscillator envelope 10 is evacuated and sealed after crystal 8 is mounted therein. The oscillator envelope 10 preferably comprises a pair of shallow, concave sections provided with respective outwardly extending rims 10a and 10b which are registered and secured by a cold weld, for thereby forming a waxed flange 16. Terminal 15, which is provided with a pair of contacts, is mounted in one of the shallow, concave sections and secured thereto by an air-tight seal.

The mounted vibrator is secured to terminal tag 15. The oscillator housing, crystal vibrator and mounting are discretely fabricated and the vibrator Q value is substantially at an optimum. The Q value is functionally related to the discrete design of resilient spring arms 12 and depending resilient spring flanges 13. When the oscillator receives a severe external shock, mounting elements 9 resile vertically and horizontally with vibrator 8 at arms 12 and flanges 13, thereby avoiding injury to the vibrator. If the spring constants of arms 12 and flanges 13 are optimally determined, the oscillator is completely shock-resistant.

Before quartz crystal vibrator 8 is mounted on cradle 14 of mounting elements 9, chromium and gold may be selectively deposited on the surface thereof and the deposition surfaces thereof may be waxed or soldered to cradle arm 14.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An improved oscillator for a timepiece comprising a terminal tag, contacts mounted in said terminal tag, an evacuated envelope hermetically sealed to said tag, a tuning fork type crystal vibrator mounted in said envelope, and a mounting for said crystal comprising a pair of connected elements depending from said terminal tag, each element including a shoulder connected to said terminal tag, an arm connected to said shoulder and forming an elbow therewith, an inwardly arranged finger connected to said arm and forming a second elbow therewith, a downwardly arranged flange depending from said finger, and a cradle member depending laterally between said flanges and connected respectively thereto for supporting said tuning fork type crystal vibrator.

2. The improved oscillator as claimed in claim 1 wherein said pair of connected elements are substantially coplanar and substantially mirror image projections relative one to the other.

3. The improved oscillator as claimed in claim 1 wherein respective arms of said respective connected elements have a resilient spring-like character wherein the resiliency thereof is normal to the vibrating direction of said crystal vibrator.

4. The improved oscillator as claimed in claim 1 wherein said flanges of said respective connected elements have a resilient spring-like character and the resilience therein is parallel to the vibrating direction of said vibrating crystal.

5. The improved oscillator as claimed in claim 1 wherein the root of said vibrating tuning fork type crystal is supported in said cradle member of said mounting.

6. The improved oscillator as claimed in claim 1 wherein said oscillator envelope comprises a pair of shallow, concave sections provided with respective outwardly extending rims, said shallow, concave sections being engaged along said respective rims thereof by a cold weld, said engaged rims thereby forming an outwardly extending flange.

7. A mounting for a tuning fork type quartz crystal vibrator having equispaced tines joined at a root of the type employed in a timepiece comprising a pair of substantially coplanar integrally connected elements in spaced relationship, one with the other, said pair being substantially mirror image projections, one of the other, each element including a shoulder, an arm connected to said shoulder and forming an elbow therewith, an inwardly arranged finger connected to said arm and forming a second elbow therewith, a downwardly arranged flange depending from said finger and a cradle member depending laterally from said flanges for supporting a tine of said tuning fork type crystal vibrator, said cradle member providing a connection between said flanges.

8. The mounting as claimed in claim 7 wherein respective arms of said elements have a resilient spring-like character wherein the resiliency thereof is normal to the vibrating direction of said crystal vibrator.

9. The mounting as claimed in claim 7 wherein said flanges of said respective elements have a resilient spring-like character and the resilience therein is parallel to the vibrating direction of said vibrating crystal.

* * * * *